US009855726B2

(12) United States Patent
Fischer et al.

(10) Patent No.: US 9,855,726 B2
(45) Date of Patent: *Jan. 2, 2018

(54) TRANSPARENT PANE WITH ELECTRICALLY CONDUCTIVE COATING

(71) Applicant: SAINT-GOBAIN GLASS FRANCE, Courbevoie (FR)

(72) Inventors: Klaus Fischer, Alsdorf (DE); Sebastian Janzyk, Herzogenrath (DE); Ariane Weissler, Aachen (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

This patent is subject to a terminal disclaimer.

(21) Appl. No.: 14/652,105

(22) PCT Filed: Dec. 5, 2013

(86) PCT No.: PCT/EP2013/075641
§ 371 (c)(1),
(2) Date: Jun. 12, 2015

(87) PCT Pub. No.: WO2014/095388
PCT Pub. Date: Jun. 26, 2014

(65) Prior Publication Data
US 2015/0321950 A1    Nov. 12, 2015

(30) Foreign Application Priority Data

Dec. 17, 2012    (EP) .................................... 12197445

(51) Int. Cl.
*E06B 3/00*    (2006.01)
*B32B 17/10*    (2006.01)
(Continued)

(52) U.S. Cl.
CPC .. *B32B 17/10036* (2013.01); *B32B 17/10183* (2013.01); *B32B 17/10229* (2013.01);
(Continued)

(58) Field of Classification Search
CPC .... H05B 3/86; E06B 3/66; G02B 5/20; B32B 17/10036; B32B 17/10229
(Continued)

(56) References Cited

U.S. PATENT DOCUMENTS

| 4,385,226 | A | | 5/1983 | Sauer | |
|---|---|---|---|---|---|
| 5,514,476 | A | * | 5/1996 | Hartig | .................... C03C 17/36 359/360 |

(Continued)

FOREIGN PATENT DOCUMENTS

| DE | 9313394 U1 | 10/1993 |
|---|---|---|
| DE | 4235063 A1 | 4/1994 |

(Continued)

OTHER PUBLICATIONS

Written Opinion mailed on Jan. 29, 2014 for PCT/EP2013/075641 filed on Dec. 5, 2013 in the name of SAINT-GOBAIN GLASS FRANCE.

(Continued)

*Primary Examiner* — Audrey Y Chang
(74) *Attorney, Agent, or Firm* — Steinfl + Bruno LLP

(57) ABSTRACT

A transparent pane having at least one transparent substrate and at least one an electrically conductive coating on at least one surface of the transparent substrate. The electrically conductive coating has at least two functional layers arranged one on top of another. Each functional layer contains: a layer of optically highly refractive material; a smoothing layer above the layer of optically highly refractive material; a lower adapting (matching) layer above the smoothing layer; an electrically conductive layer above the (Continued)

Figure 1:
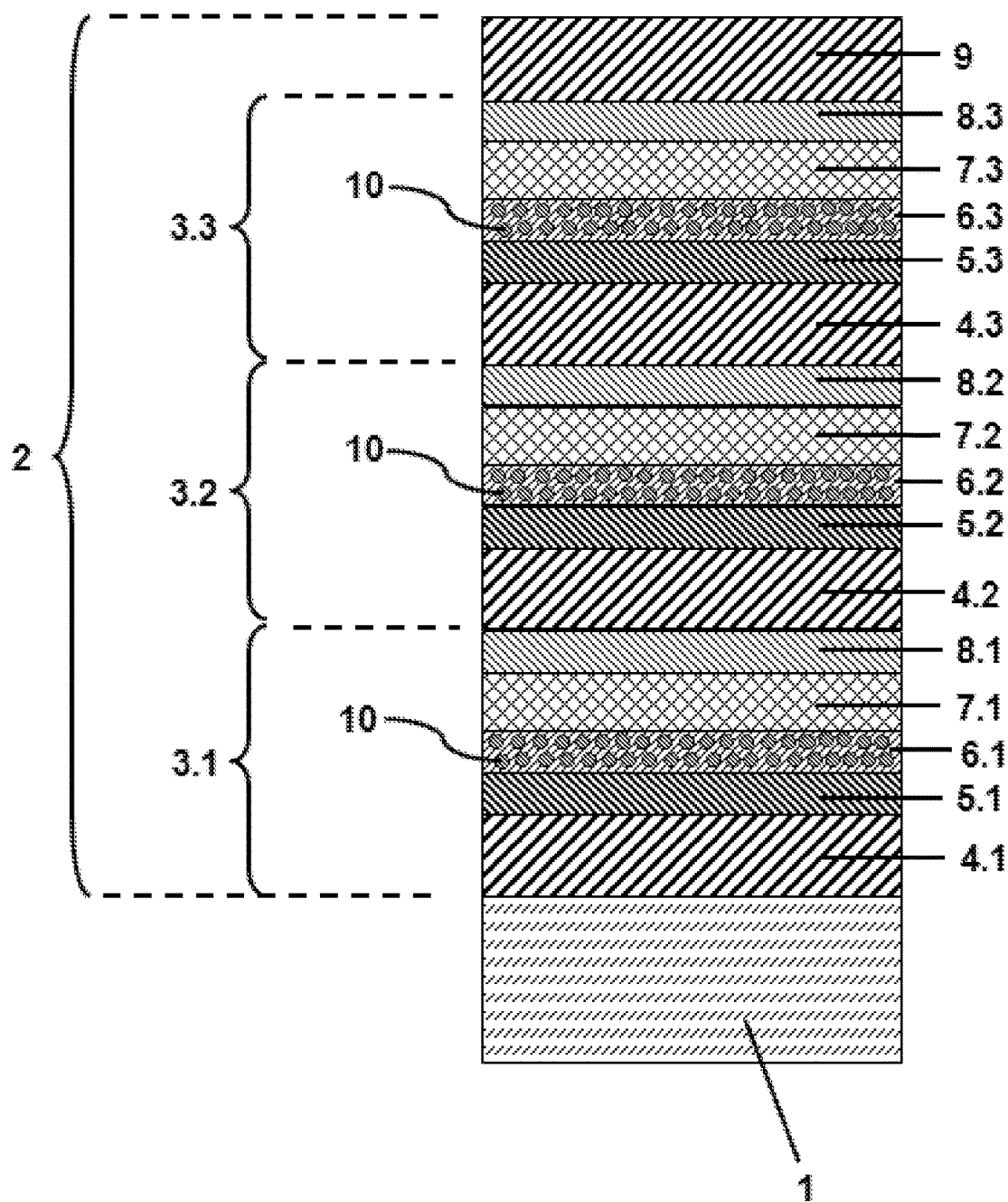

lower adapting layer; and an upper adapting (matching) layer above the electrically conductive layer. The lower adapting layer and/or the upper adapting layer contain a homogeneously distributed getter material. At least one lower adapting layer and/or upper adapting layer containing the getter material is in direct contact with the electrically conductive layer.

24 Claims, 3 Drawing Sheets

(51) Int. Cl.
*H05K 1/02* (2006.01)
*C03C 17/36* (2006.01)
*C23C 14/34* (2006.01)
*E06B 3/66* (2006.01)
*H05B 3/86* (2006.01)

(52) U.S. Cl.
CPC ........ *B32B 17/10761* (2013.01); *C03C 17/36* (2013.01); *C03C 17/3618* (2013.01); *C03C 17/3626* (2013.01); *C03C 17/3636* (2013.01); *C03C 17/3639* (2013.01); *C03C 17/3644* (2013.01); *C03C 17/3652* (2013.01); *C03C 17/3673* (2013.01); *C23C 14/34* (2013.01); *E06B 3/66* (2013.01); *H05B 3/86* (2013.01); *H05K 1/0274* (2013.01); *H05B 2203/013* (2013.01)

(58) Field of Classification Search
USPC .................. 428/34, 216, 219, 670; 359/585
See application file for complete search history.

(56) References Cited

U.S. PATENT DOCUMENTS

| | | | |
|---|---|---|---|
| 6,045,896 A | 4/2000 | Boire et al. | |
| 6,398,925 B1 | 6/2002 | Arbab et al. | |
| 6,540,884 B1 | 4/2003 | Siddle et al. | |
| 7,173,750 B2 * | 2/2007 | Rukavina | G02F 1/153 |
| | | | 359/265 |
| 7,745,009 B2 * | 6/2010 | Decroupet | C03C 17/36 |
| | | | 359/360 |
| 8,786,176 B2 | 7/2014 | Lecamp et al. | |
| 9,215,760 B2 * | 12/2015 | Fischer | H05B 3/84 |
| 9,359,807 B2 * | 6/2016 | Schmitz | H05B 3/84 |
| 2003/0143435 A1 | 7/2003 | Schicht et al. | |
| 2007/0020465 A1 | 1/2007 | Thiel et al. | |
| 2007/0082219 A1 | 4/2007 | Fleury et al. | |
| 2007/0108175 A1 | 5/2007 | Andrt | |
| 2007/0187382 A1 | 8/2007 | Mauser | |
| 2011/0212336 A1 | 9/2011 | Kawamoto et al. | |
| 2011/0268941 A1 | 11/2011 | Fischer et al. | |
| 2014/0017472 A1 * | 1/2014 | Coster | B32B 17/10036 |
| | | | 428/219 |

FOREIGN PATENT DOCUMENTS

| | | |
|---|---|---|
| DE | 19848751 C1 | 12/1999 |
| DE | 10333618 B3 | 3/2005 |
| DE | 10352464 A1 | 6/2005 |
| DE | 202004019286 U1 | 4/2006 |
| DE | 69731268 T2 | 9/2006 |
| EA | 021647 B1 | 8/2015 |
| EP | 0025755 B1 | 3/1981 |
| EP | 0803481 A2 | 10/1997 |
| EP | 1849594 A1 | 10/2007 |
| EP | 2444381 A1 | 4/2012 |
| FR | 2936510 A1 | 4/2010 |
| JP | H11-157881 A | 6/1999 |
| JP | 2008-532914 A | 8/2008 |
| WO | 00/37383 A1 | 6/2000 |
| WO | 03/024155 A2 | 3/2003 |
| WO | 2010/055832 A1 | 5/2010 |

OTHER PUBLICATIONS

International Preliminary Report on Patentability mailed on Jun. 23, 2015 for PCT/EP2013/075641 filed on Dec. 5, 2013 in the name of SAINT-GOBAIN GLASS FRANCE.

International Search Report mailed on Jan. 29, 2014 for PCT/EP2013/075641 filed on Dec. 5, 2013 in the name of SAINT-GOBAIN GLASS FRANCE.

* cited by examiner

A - A'

TRANSPARENT PANE WITH ELECTRICALLY CONDUCTIVE COATING

CROSS REFERENCE TO RELATED APPLICATIONS

The present application is the US national stage of International Patent Application PCT/EP2013/075641 filed internationally on Dec. 5, 2013 which, in turn, claims priority to European Patent Application No. 12197445.5 filed on Dec. 17, 2012.

The invention relates to a transparent pane with an electrically conductive coating, a method for its production, and its use.

The field of vision of a motor vehicle window, in particular a windshield, must be kept free of ice and condensation. In the case of motor vehicles with an internal combustion engine, a stream of air heated by engine heat can, for example, be directed to the windows.

Alternatively, the window can have an electrical heating function. From DE 103 52 464 A1, for example, a composite glass pane is known in which electrically heatable wires are placed between two glass panes. The specific heating output P, for example, roughly 600 W/m², can be adjusted by the ohmic resistance of the wires. Because of design and safety aspects, the number of wires as well as the diameter of the wires must be kept as small as possible. The wires must not be visible or must be hardly perceptible in daylight and at night with headlight illumination.

Also known are transparent, electrically conductive coatings, in particular based on silver. WO 03/024155 A2 discloses, for example, an electrically conductive coating with two silver layers. Such coatings usually have sheet resistances in the range from 3 ohm/square to 5 ohm/square.

The specific heating output P of an electrically heatable coating with a sheet resistance $R_{square}$, an operating voltage U, and a distance h between two busbars can be calculated with the formula $P=U^2/(R_{square}*h^2)$. The distance h between two busbars is, in typical windshields of passenger cars, roughly 0.8 m, which corresponds approx. to the height of the pane. In order to obtain a desired specific heating output P of 600 W/m² with a sheet resistance of 4 ohm/square, an operating voltage U of roughly 40 V is necessary. Since the onboard voltage of motor vehicles is usually 14 V, a power supply or a voltage converter is necessary to generate an operating voltage of 40 V. A voltage increase from 14 V to 40 V is always associated with electrical line losses and additional costs for additional components.

US 2007/0082219 A1 and US 2007/0020465 A1 disclose transparent, electrically conductive coatings with at least three silver layers. In US 2007/0082219 A1, sheet resistances near 1 ohm/square are reported for coatings based on three silver layers. An operating voltage U=14 V, a sheet resistance $R_{square}=1$ ohm/square and a distance h=0.8 m yield a specific heating output P of roughly 300 W/m².

To provide an adequate specific heating output P, for example, roughly 500 W/m², in particular for heating relatively large panes, a further reduction of the sheet resistance of the electrically heatable coating is essential. This can be achieved with an electrically heatable coating with, typically, three silver layers by increasing the thickness of the individual silver layers. However, an excessive layer thickness of the silver layers results in inadequate optical properties of the pane, in particular with regard to transmittance and color appearance, such that legal regulations, as specified, for example, in ECE R 43 ("Uniform Provisions concerning the Approval of Safety Glazing and Composite Glass Materials"), cannot be complied with. Accordingly, the silver layers must be dimensioned such that the conductivity is high enough for adequate heating with simultaneously sufficient transmittance. The conductivity of the layers depends primarily on the crystallinity of the deposited silver.

Generally, the deposition of the layer system on a glass pane is done before the bending and the lamination of the windshield. Thus, the coating must have adequate thermal load capacity. However, the heating of the coated pane in the bending process results in oxidation of the silver layer. EP 2444381 A1 solves this problem through application of a blocker layer adjacent the silver-containing layer. This blocker layer serves, in particular, to stabilize the silver-containing layer during the thermal processing and improves the optical quality of the electrically heatable coating. EP 2444381 A1 discloses a blocker layer containing niobium, titanium, nickel, chromium, or alloys thereof, particularly preferably nickel-chromium alloys. However, a disadvantage of this solution is that the layer has an undesirable negative effect on the crystallinity of the silver-containing layer.

The object of the present invention consists in providing a transparent pane with an electrically conductive coating, which, compared to the prior art, has improved crystallinity and lower sheet sheet resistance $R_{square}$, as well as an economical method for its production. The pane should have high transmittance and high color neutrality and be economically producible.

The object of the present invention is accomplished according to the invention by a transparent pane with a conductive coating, a method for its production, and its use in accordance with the independent claims 1, 12, and 15. Preferred embodiments emerge from the subclaims.

The transparent pane according to the invention comprises at least one transparent substrate and at least one electrically conductive coating on at least one surface of the transparent substrate, wherein
- the electrically conductive coating has at least two functional layers arranged one above the other, and each functional layer comprises at least
- one layer of an optically highly refractive material with a refractive index greater than or equal to 2.1,
- above the layer of an optically highly refractive material, a smoothing layer that contains at least one non-crystalline oxide,
- above the smoothing layer, a lower matching layer,
- above the lower matching layer, an electrically conductive layer, and
- above the electrically conductive layer, an upper matching layer,
- the lower matching layer and/or the upper matching layer contains a getter material from the group consisting of niobium, titanium, barium, magnesium, tantalum, zirconium, thorium, palladium, platinum, and alloys thereof, which is homogeneously distributed in the entire cross-section of the layer, and
at least one lower matching layer and/or upper matching layer containing the getter material is in direct contact with each electrically conductive layer.

The getter material of the matching layers protects the adjacent electrically conductive layers against oxidation. Thus, by means of the layer structure according to the invention, all electrically conductive layers of the transparent pane are protected against oxidation. Since the matching layers according to the invention are directly adjacent the electrically conductive layers, the crystallinity of the matching layers is optimally transferred to the conductive layers.

If a first layer is arranged above a second layer, this means, in the context of the invention, that the first layer is arranged farther from the transparent substrate than the second layer. If a first layer is arranged below a second layer, this means, in the context of the invention, that the second layer is arranged farther from the transparent substrate than the first layer. The uppermost functional layer is that functional layer that is at the greatest distance from the transparent substrate. The lowest functional layer is that functional layer that is at the least distance from the transparent substrate.

In the context of the invention, a layer can be made of one material. However, a layer can also comprise two or more individual layers of different materials. A functional layer according to the invention comprises, for example, at least one layer of optically highly refractive material, a smoothing layer, a lower and an upper matching layer, and an electrically conductive layer.

If a first layer is arranged above or below a second layer, this does not necessarily mean, in the context of the invention, that the first and the second layer are in direct contact with each other. One or more other layers can be arranged between the first and the second layer, so long as this is not explicitly ruled out.

According to the invention, the electrically conductive coating is applied at least on one surface of the transparent substrate. However, both surfaces of the transparent substrate can also be provided with an electrically conductive coating according to the invention.

The electrically conductive coating can extend over the entire surface of the transparent substrate. However, alternatively, the electrically conductive coating can extend over only a part of the surface of the transparent substrate. The electrically conductive coating preferably extends over at least 50%, particularly preferably over at least 70%, and most particularly preferably over at least 90% of the surface of the transparent substrate.

The electrically conductive coating can be applied directly on the surface of the transparent substrate. The electrically conductive coating can, alternatively, be applied on a carrier film that is adhesively bonded to the transparent substrate.

In the context of the invention, "optically highly refractive material" refers to a material whose refractive index is greater than or equal to 2.1. According to the prior art, layer sequences are known in which the electrically conductive layers are arranged in each case between two dielectric layers. These dielectric layers customarily include silicon nitride. The layers of an optically highly refractive material according to the invention result in a reduction of the sheet resistance of the electrically conductive layers with simultaneously good optical characteristics of the transparent pane, in particular high transmittance and neutral color effect. Advantageously low values for the sheet resistance and, thus, high specific heating outputs can be achieved by means of the layers of an optically highly refractive material together with the smoothing layers according to the invention.

The values reported for refractive indices are measured at a wavelength of 550 nm.

The transparent pane according to the invention with an electrically conductive coating preferably has a total transmittance greater than 70%. The term "total transmittance" is based on the process for testing the light permeability of motor vehicle windows specified by ECE-R 43, Annex 3, §9.1.

The electrically conductive coating preferably has a sheet resistance of less than 1 ohm/square. The sheet resistance of the electrically conductive coating is particularly preferably from 0.4 ohm/square to 0.9 ohm/square. In this range for the sheet resistance, advantageously high specific heating outputs P are achieved.

The lower matching layer and/or the upper matching layer includes a getter material homogeneously distributed in the entire cross-section of the layer. The getter material comes from the group consisting of niobium, titanium, barium, magnesium, tantalum, zirconium, thorium, palladium, platinum. The getter material binds oxygen such that adjacent conductive layers are protected against oxidation. The application of an additional blocker layer containing such a getter material is unnecessary. The blocker layers known according to the prior art prevent the extension of the crystallinity of the underlying matching layer to the conductive layer. Omission of the blocker layer thus improves the crystallinity of the conductive layer and, as a result, its conductivity as well. Thus, the specific heating output can be increased by the particularly advantageous combination according to the invention of the matching layer and the getter material.

The getter material of the matching layer according to the invention is homogeneously distributed therein and, in contrast to the blocker layers known according to the prior art, is applied not only on the surface of the matching layer but is contained therein. In the cross-section of the matching layer, the getter material can even present local accumulations; however, on average there is homogeneous distribution of the getter material over the entire cross-sectional area. Thus, exactly as much getter material is available on the surface of the matching layer facing the smoothing layer as on the surface facing the conductive layer. By means of this uniform distribution of the getter material in the matching layer, adequate getter material is present for the absorption of oxygen. In addition, the crystallinity of the matching layer is optimally transferred to the conductive layer, since the surface of the matching layer is not covered by a blocker layer. The electrically conductive coating according to the invention thus has, in contrast to the prior art, increased conductivity along with the same oxidation stability.

The getter material can, moreover, contain nickel, chromium, aluminum, and/or alloys thereof.

To increase the total transmittance and/or to reduce the sheet resistance, the transparent pane with an electrically conductive coating can be subjected to a temperature treatment, for example, at a temperature from 500° C. to 700° C.

It has been demonstrated that the electrically conductive coating according to the invention can be subjected to such a temperature treatment without the coating being damaged by oxidation. The transparent pane according to the invention can also be convexly or concavely bent without the coating being damaged by oxidation. These are major advantages of the electrically conductive coating according to the invention.

Preferably, the lower matching layer and/or the upper matching layer contains the getter material in a concentration from 1 wt.-% to 10 wt.-%, preferably 2 wt.-% to 10 wt.-%, particularly preferably 3 wt.-% to 10 wt.-%, most particularly preferably 3 wt.-% to 7 wt.-%, in particular 4 wt.-% to 6 wt.-%. In the concentration range above 3 wt.-%, particularly good protection of the electrically conductive layers against oxidation can be observed.

Preferably, the getter material contains titanium.

The electrically conductive coating has two to five functional layers.

In a preferred embodiment of the invention, the electrically conductive coating has three functional layers. The production of an electrically conductive coating with four or more electrically conductive layers is technically complicated and costly. However, due to the improved conductivity of the functional layer structure according to the invention, sufficiently high heating output is obtained even with three functional layers.

In another preferred embodiment, the electrically conductive coating has four functional layers. Since, in the method according to the invention, the matching layer and the getter material are deposited from a common target that contains both components, there is a free cathode space in the coating system. In a system according to the prior art, this cathode space accommodates the target for depositing the blocker layer. With the freeing of this cathode space, another target for depositing a fourth electrically conductive layer can be attached there. This makes the production of an electrically conductive coating with four functional layers substantially simpler and substantially more economical with the same sized system.

The layer of an optically highly refractive material preferably has a refractive index n from 2.1 to 2.5, particularly preferably from 2.1 to 2.3.

The layer of an optically highly refractive material preferably contains at least one mixed silicon/metal nitride, particularly preferably mixed silicon/zirconium nitride. This is particularly advantageous with regard to the sheet resistance of the electrically conductive coating. The mixed silicon/zirconium nitride preferably has dopants. The layer of an optically highly refractive material can, for example, contain an aluminum-doped mixed silicon/zirconium nitride ($SiZrN_x$:Al).

The mixed silicon/zirconium nitride is preferably deposited by means of magnetic field supported cathode sputtering with a target that contains from 40 wt.-% to 70 wt.-% silicon, from 30 wt.-% to 60 wt.-% zirconium, and from 0 wt.-% to 10 wt.-% aluminum as well as production-related admixtures. The target particularly preferably contains from 45 wt.-% to 60 wt.-% silicon, from 35 wt.-% to 55 wt.-% zirconium, and from 3 wt.-% to 8 wt.-% aluminum as well as production-related admixtures. The deposition of the mixed silicon/zirconium nitride preferably takes place under addition of nitrogen as reaction gas during the cathode sputtering.

However, the layer of an optically highly refractive material can also contain, for example, at least mixed silicon/aluminum nitride, mixed silicon/hafnium nitride, or mixed silicon/titanium nitride. Alternatively, the layer of an optically highly refractive material can contain, for example, MnO, $WO_3$, $Nb_2O_5$, $Bi_2O_3$, $TiO_2$, $Zr_3N_4$, and/or AlN.

The layer thickness of each layer of an optically highly refractive material that is arranged between two electrically conductive layers is preferably from 35 nm to 70 nm, particularly preferably from 45 nm to 60 nm. In this range for the layer thickness, particularly advantageous sheet resistances of the electrically conductive coating and particularly good optical properties of the transparent pane are achieved. In the context of the invention, a layer of an optically highly refractive material is arranged between two electrically conductive layers, if at least one electrically conductive layer is arranged above the layer of an optically highly refractive material and if at least one electrically conductive layer is arranged below the layer of an optically highly refractive material. However, according to the invention, the layer of an optically highly refractive material is not in direct contact with the adjacent electrically conductive layers.

The layer thickness of the lowest layer of an optically highly refractive material is preferably from 20 nm to 40 nm. Particularly good results are thus obtained.

In an advantageous embodiment of the invention, a cover layer is arranged above the uppermost functional layer. The cover layer protects the layers arranged thereunder against corrosion. The cover layer is preferably dielectric. The cover layer can, for example, contain silicon nitride and/or tin oxide.

The cover layer preferably contains at least one optically highly refractive material with a refractive index greater than or equal to 2.1. The cover layer particularly preferably contains at least one mixed silicon/metal nitride, in particular mixed silicon/zirconium nitride, such as aluminum-doped mixed silicon/zirconium nitride. This is particularly advantageous with regard to the optical properties of the transparent pane according to the invention. However, the cover layer can also contain other mixed silicon/metal nitrides, for example, mixed silicon/aluminum nitride, mixed silicon/hafnium nitride, or mixed silicon/titanium nitride. Alternatively, the cover layer can also contain, for example, MnO, $WO_3$, $Nb_2O_5$, $Bi_2O_3$, $TiO_2$, $Zr_3N_4$, and/or AlN.

The layer thickness of the cover layer is preferably from 20 nm to 40 nm. Particularly good results are thus obtained.

According to the invention, each functional layer of the electrically conductive coating includes at least one smoothing layer. The smoothing layer is arranged below the first matching layer, preferably between the layer of an optically highly refractive material and the first matching layer. The smoothing layer is preferably in direct contact with the first matching layer. The smoothing layer effects an optimization, in particular smoothing of the surface for an electrically conductive layer subsequently applied above. An electrically conductive layer deposited on a smoother surface has a higher degree of transmittance with a simultaneously lower sheet resistance.

The smoothing layer contains at least one non-crystalline oxide. The oxide can be amorphous or partially amorphous (and thus partially crystalline) but is not completely crystalline. The non-crystalline smoothing layer has low roughness and thus forms an advantageously smooth surface for the layers to be applied above the smoothing layer. The non-crystalline smoothing layer further effects an improved surface structure of the layer deposited directly above the smoothing layer, which is preferably the first matching layer.

The smoothing layer can, for example, contain at least one oxide of one or more of the elements tin, silicon, titanium, zirconium, hafnium, zinc, gallium, and indium.

The smoothing layer preferably contains a non-crystalline mixed oxide. The smoothing layer most particularly preferably contains a mixed tin/zinc oxide. The mixed oxide can have dopants. The smoothing layer can, for example, contain an antimony-doped mixed tin/zinc oxide ($SnZnO_x$:Sb). The mixed oxide preferably has a substoichiometric oxygen content. A method for producing mixed tin/zinc oxide layers by reactive cathode sputtering is known, for example, from DE 198 48 751 C1. The mixed tin/zinc oxide is preferably deposited with a target that contains from 25 wt.-% to 80 wt.-% zinc, from 20 wt.-% to 75 wt.-% tin, and from 0 wt.-% to 10 wt.-% antimony as well as production-related admixtures. The target particularly preferably contains from 45 wt.-% to 75 wt.-% zinc, from 25 wt.-% to 55 wt.-% tin, and from 1 wt.-% to 5 wt.-% antimony as well as production-related admixtures of other metals. The deposition of the mixed tin/zinc oxide takes place under addition of oxygen as reaction gas during the cathode sputtering.

The layer thickness of a smoothing layer is preferably from 3 nm to 20 nm, particularly preferably from 4 nm to 12 nm. The smoothing layer preferably has a refractive index of less than 2.2.

The electrically conductive layer preferably contains at least one metal, for example, gold or copper, or an alloy, particularly preferably silver or a silver-containing alloy. However, the electrically conductive layer can also contain other electrically conductive materials known to the person skilled in the art.

In an advantageous embodiment of the invention, the electrically conductive layer contains at least 90 wt.-% silver, preferably at least 99.9 wt.-% silver. The electrically conductive layer is preferably applied using conventional methods of layer deposition of metals, for example, by vacuum methods, such as magnetic field supported cathode sputtering.

The electrically conductive layer preferably has a layer thickness from 8 nm to 25 nm, particularly preferably from 10 nm to 20 nm. This is particularly advantageous with regard to the transparency and the sheet resistance of the electrically conductive layer.

The total layer thickness of all the electrically conductive layers is, according to the invention, from 32 nm to 75 nm. In this range for the total thickness of all electrically conductive layers, with distances h between two busbars typical for motor vehicle windows, in particular windshields, and an operating voltage U from 12 V to 15 V, an adequately high specific heating output P and, simultaneously, an adequately high transmittance are advantageously achieved. Excessively low total layer thicknesses of all the electrically conductive layers yield an excessively high sheet resistance $R_{square}$ and, thus, an excessively low specific heating output P. Excessively high total layer thicknesses of all the electrically conductive layers reduce the transmittance through the pane too greatly, such that the requirements for the transmittance of motor vehicle windows according to ECE R 43 are not met. It has been demonstrated that particularly good results are achieved with a total layer thickness of all the electrically conductive layers from 50 nm to 60 nm, in particular from 51 nm to 58 nm. This is particularly advantageous with regard to the sheet resistance of the electrically conductive coating and the transmittance of the transparent pane.

The lower matching layer and/or the upper matching layer preferably contains zinc oxide $ZnO_{1-\delta}$ with $0<\delta<0.01$. The zinc oxide is preferably deposited substoichiometrically relative to the oxygen to prevent a reaction of excess oxygen with the silver-containing layer as well as with the getter material. Besides zinc oxide, other ceramic components can also be contained in the matching layers. Preferably, other oxides, for example, aluminum oxide, are added. The zinc oxide layer is preferably deposited by magnetic field supported cathode sputtering. The lower matching layer and/or the upper matching layer contains the getter material. At least one matching layer within each functional layer includes the getter material. The second matching layer of the functional layer can, optionally, contain a getter material.

The target for depositing a matching layer with getter material contains 90 wt.-% to 99 wt.-% zinc-oxide-based ceramic and 1 wt.-% to 10 wt.-% of the getter material, preferably 90 wt.-% to 98 wt.-% zinc-oxide-based ceramic and 2 wt.-% to 10 wt.-% of the getter material, particularly preferably 90 wt.-% to 97 wt.-% zinc-oxide-based ceramic and 3 wt.-% to 10 wt.-% of the getter material, most particularly preferably 93 wt.-% to 97 wt.-% zinc-oxide-based ceramic and 3 wt.-% to 7 wt.-% of the getter material, in particular 94 wt.-% to 96 wt.-% zinc-oxide-based ceramic and 4 wt.-% to 6 wt.-% of the getter material. This zinc-oxide-based ceramic can, for its part, in turn contain other oxidic components, for example, aluminum oxide. In a preferred embodiment, the zinc-oxide-based ceramic contains 85 wt.-% to 100 wt.-% zinc oxide, particularly preferably 95 wt.-% to 99 wt.-% zinc oxide as well as 1 wt.-% to 5 wt.-% aluminum oxide. Moreover, production-related admixtures can be included. Preferably, titanium is used as getter material. In depositing a matching layer without getter material, a target containing 85 wt.-% to 100 wt.-% zinc oxide as well as production-related admixtures is preferably used. Particularly preferably, the target contains 85 wt.-% to 99 wt.-% zinc oxide and 1 wt.-% to 15 wt.-% aluminum oxide, in particular 95 wt.-% to 99 wt.-% zinc oxide and 1 wt.-% to 5 wt.-% aluminum oxide as well as respective production-related admixtures. The deposition of the upper matching layer and the lower matching layer is preferably done by magnetic field supported cathode sputtering under the use of an inert gas, for example, argon or krypton. Matching layers that contain no getter material can also be deposited, alternatively, using metal targets under the addition of oxygen as reaction gas, as is well known according to the prior art and is disclosed, for example, in EP 2444381 A1.

The layer thicknesses of the lower matching layer and of the upper matching layer are preferably from 3 nm to 20 nm, particularly preferably from 4 nm to 12 nm.

Both the upper matching layer and the lower matching layer can contain a getter material, with, preferably, at least the lower matching layer containing a getter material. The lower matching layer with getter material is situated directly below the electrically conductive layer and serves in particular to stabilize the electrically conductive layer against oxidation. This improves the optical quality of the electrically conductive coating. The upper matching layer is applied directly above the electrically conductive layer.

The transparent substrate preferably contains glass, particularly preferably flat glass, float glass, quartz glass, borosilicate glass, soda lime glass, or clear plastics, preferably rigid clear plastics, in particular polyethylene, polypropylene, polycarbonate, polymethyl methacrylate, polystyrene, polyamide, polyester, polyvinyl chloride, and/or mixtures thereof. Examples of appropriate types of glass are known from DE 697 31 268 T2, page 8, paragraph[0053].

The thickness of the transparent substrate can vary widely and thus be ideally adapted to the requirements of the individual case. Preferably, panes with the standard thicknesses from 1.0 mm to 25 mm and preferably from 1.4 mm to 2.6 mm are used. The size of the transparent substrate can vary widely and is determined by the use according to the invention. The transparent substrate has, for example, in the automotive sector and in the architectural sector, customary areas from 200 $cm^2$ all the way to 4 $m^2$.

The transparent substrate can have any three-dimensional shape. Preferably, the three-dimensional shape has no shadow zones such that it can, for example, be coated by cathode sputtering. The transparent substrate is preferably planar or slightly or greatly curved in one or a plurality of spatial directions. The transparent substrate can be colorless or tinted.

In an advantageous embodiment of the invention, the transparent substrate is bonded to a second pane via at least one laminating film to form a composite pane. The electrically conductive coating according to the invention is preferably applied on the surface of the transparent substrate facing the laminating film. Thus, the electrically conductive coating is advantageously protected against damage and corrosion.

The composite pane preferably has a total transmittance greater than 70%.

Die laminating film preferably contains thermoplastic plastics, for example, polyvinyl butyral (PVB), ethylene vinyl acetate (EVA), polyurethane (PU), polyethylene terephthalate (PET), or multiple layers thereof, preferably with thicknesses from 0.3 mm to 0.9 mm.

The second pane preferably contains glass, particularly preferably flat glass, float glass, quartz glass, borosilicate glass, soda lime glass, or clear plastics, preferably rigid clear plastics, in particular polyethylene, polypropylene, polycarbonate, polymethyl methacrylate, polystyrene, polyamide, polyester, polyvinyl chloride, and/or mixtures thereof. The second pane preferably has a thickness from 1.0 mm to 25 mm and particularly preferably from 1.4 mm to 2.6 mm.

The electrically conductive coating preferably extends over the entire surface of the transparent substrate, minus a circumferential frame-like coating-free region with a width from 2 mm to 20 mm, preferably from 5 mm to 10 mm. The coating-free region is preferably hermetically sealed by the laminating film or by an acrylate adhesive as a vapor diffusion barrier. The corrosion-sensitive electrically conductive coating is protected against moisture and atmospheric oxygen by the vapor diffusion barrier. If the composite pane is provided as a motor vehicle window, for example, as a windshield, the circumferential coating-free region also effects electrical insulation between the voltage-carrying coating and the motor vehicle body.

The transparent substrate can be coating-free in at least one other region, which serves, for example, as a data transmission window or a communication window. In the other coating-free region, the transparent pane is permeable to electromagnetic radiation and, in particular, to infrared radiation.

The electrically conductive coating can be applied directly on the surface of the transparent substrate. Alternatively, the electrically conductive coating can be applied on a carrier film that is embedded between two laminating films. The carrier film preferably contains a thermoplastic polymer, in particular polyvinyl butyral (PVB), ethylene vinyl acetate (EVA), polyurethane (PU), polyethylene terephthalate (PET), or combinations thereof.

The transparent substrate can, for example, also be bonded to a second pane via spacers to form an insulating glazing unit. The transparent substrate can also be bonded to more than one other pane via laminating films and/or spacers. If the transparent substrate is bonded to one or a plurality of other panes, one or a plurality of these other panes can also have an electrically conductive coating.

In a particularly advantageous embodiment, the electrically conductive coating is equipped with suitable means for applying a voltage and is thus heatable. Alternatively, the electrically conductive coating can also be used unheated, for example, for shielding against IR radiation, by which means the heating of the vehicle interior by direct sunlight is reduced.

Preferably, the electrically conductive coating is connected via busbars to a voltage source and a voltage applied on the electrically conductive coating preferably has a value from 12 V to 15 V. The busbars serve to transfer electrical power. Examples of suitable busbars are known from DE 103 33 618 B3 and EP 0 025 755 B1.

The busbars are advantageously produced by printing a conductive paste. If the transparent substrate is bent after application of the electrically conductive coating, the conductive paste is preferably fired before the bending and/or at the time of the bending of the transparent substrate. The conductive paste preferably contains silver particles and glass frits. The layer thickness of the fired conductive paste is preferably from 5 µm to 20 µm.

In an alternative embodiment, thin and narrow metal foil strips or metal wires are used as busbars, which preferably contain copper and/or aluminum; in particular, copper foil strips with a thickness of preferably 10 µm to 200 µm, for example, roughly 50 µm, are used. The width of the copper foil strips is preferably 1 mm to 10 mm. The electrical contact between the electrically conductive coating and the busbar can, for example, be produced by soldering or gluing with an electrically conductive adhesive. If the transparent substrate is part of a composite glass, the metal foil strips or metal wires can be placed on the electrically conductive coating during the assembly of the composite layers. In the subsequent autoclave process, a secure electrical contact between the busbars and the coating is achieved through the action of heat and pressure.

In the automotive sector, foil conductors are customarily used as feed lines for contacting busbars in the interior of composite panes. Examples of foil conductors are described in DE 42 35 063 A1, DE 20 2004 019 286 U1, and DE 93 13 394 U1.

Flexible foil conductors, sometimes also called "flat conductors" or "flat-band conductors", are preferably made of a tinned copper strip with a thickness from 0.03 mm to 0.1 mm and a width from 2 mm to 16 mm. Copper has proved successful for such conductor tracks, since it has good electrical conductivity as well as good processability into foils. At the same time, material costs are low. Other electrically conductive materials that can be processed into foils can also be used. Examples for this are aluminum, gold, silver, or tin and alloys thereof.

For electrical insulation and for stabilization, the tinned copper strip is applied on a carrier material made of plastic or laminated therewith on both sides. The insulation material contains, as a rule, a 0.025-mm- to 0.05-mm-thick polyimide-based film. Other plastics or materials with the required insulating properties can also be used. A plurality of conductive layers electrically isolated from each other can be situated in one foil conductor strip.

Foil conductors that are suitable for contacting electrically conductive layers in composite panes have a total thickness of only 0.3 mm. Such thin foil conductors can be embedded without difficulty in the laminating film between the individual panes.

Alternatively, thin metal wires can also be used as feed lines. The metal wires contain, in particular, copper, tungsten, gold, silver, or aluminum or alloys of at least two of these metals. The alloys can also contain molybdenum, rhenium, osmium, iridium, palladium, or platinum.

The invention further includes a method for producing a transparent pane according to the invention with an electrically conductive coating, wherein at least two functional layers are applied one after another on a transparent substrate and for applying each functional layer one after another at least a) one layer of an optically highly refractive material with a refractive index greater than or equal to 2.1, b) a smoothing layer that contains at least one non-crystalline oxide, c) a lower matching layer, d) an electrically conductive layer, and
e) an upper matching layer are applied and wherein the lower matching layer and/or the upper matching layer is applied simultaneously with a getter material contained therein.

The individual layers are deposited by methods known per se, for example, by magnetic field supported cathode sputtering. The cathode sputtering takes place in a protective gas atmosphere, for example, of argon or krypton, or in a reactive gas atmosphere, for example, through addition of oxygen or nitrogen.

The upper matching layer and/or the lower matching layer are deposited, to the extent they contain a getter material, by magnetic field supported cathode sputtering under the use of an inert gas. Ceramic targets are used as the target. In a preferred embodiment, a zinc-oxide-based ceramic target that is doped with a getter material, preferably with titanium, is used. Metallic targets cannot be used for depositing matching layers with getter material in the method according to the invention, since these must be deposited in the presence of oxygen to produce a ceramic layer, for instance, zinc oxide, and a getter material contained in the target would be oxidized. With the use of a ceramic target, zinc is present already in the oxidized form, as zinc oxide such that this can be deposited with argon or krypton as an inert gas. The getter material contained in the target, for example, titanium, is not oxidized.

The upper matching layer and/or the upper matching layer are preferably deposited by cathode ray sputtering of a ceramic target containing 1 wt.-% to 10 wt.-%, preferably 2 wt.-% to 8 wt.-%, particularly preferably 3 wt.-% to 7 wt.-% of the getter material. The ceramic target is preferably zinc-oxide based. In a particularly preferred embodiment, the zinc-oxide-based ceramic contains 95 wt.-% to 99 wt.-% ZnO and 1 wt.-% to 5 wt.-% $Al_2O_3$. This zinc-oxide-based ceramic forms, with a fraction from 90 wt.-% to 100 wt.-%, the primary component of the target for depositing the matching layers. If the resulting matching layer is to contain a getter material, the target used for its deposition contains 90 wt.-% to 99 wt.-% of the zinc-oxide-based ceramic as well as 1 wt.-% to 10 wt.-% of the getter material, preferably 92 wt.-% to 98 wt.-% of the zinc-oxide-based ceramic and 2 wt.-% to 8 wt.-% of the getter material, particularly preferably 93 wt.-% to 97 wt.-% of the zinc-oxide-based ceramic and 3 wt.-% to 7 wt.-% of the getter material.

Preferably, the matching layers according to the invention with getter material are deposited at a pressure from 0.5 μbar to 5 μbar using a pulsed DC voltage source with argon as an inert gas. Particularly preferably, the deposition is done by multifrequency cathode sputtering at 25 kHz to 50 kHz using two targets that have an opposing periodically changing charge during the sputtering procedure.

The layer thicknesses of the individual layers with the desired properties with regard to transmittance, sheet resistance, and color values emerge for the person skilled in the art in a simple manner through simulations in the range of the above indicated layer thicknesses.

In an advantageous embodiment of the invention, the electrically conductive coating is connected to at least two busbars, the transparent substrate and a second pane are heated to a temperature from 500° C. to 700° C., and the transparent substrate and the second pane are bonded congruently to a laminating film. The heating of the pane can take place within a bending process. The electrically conductive coating must, in particular, be suited to withstand the bending process and/or the laminating process without damage. The properties, in particular, the sheet resistance of the above described electrically conductive coating are regularly improved by heating.

The invention further includes the use of the transparent pane according to the invention as a pane or as a component of a pane, in particular as a component of an insulating glazing unit or a composite pane, in buildings or in means of transportation for travel on land, in the air, or on water, in particular in motor vehicles, for example, as a windshield, rear window, side window, and/or roof pane or as a component of a windshield, rear window, side window, and/or roof pane.

In the following, the invention is explained in detail with reference to drawings and exemplary embodiments. The drawings are a schematic representation and are not true to scale. The drawings in no way restrict the invention.

They depict:

FIG. 1 a cross-section through an embodiment of the transparent pane according to the invention with an electrically conductive coating.

Figure 2:
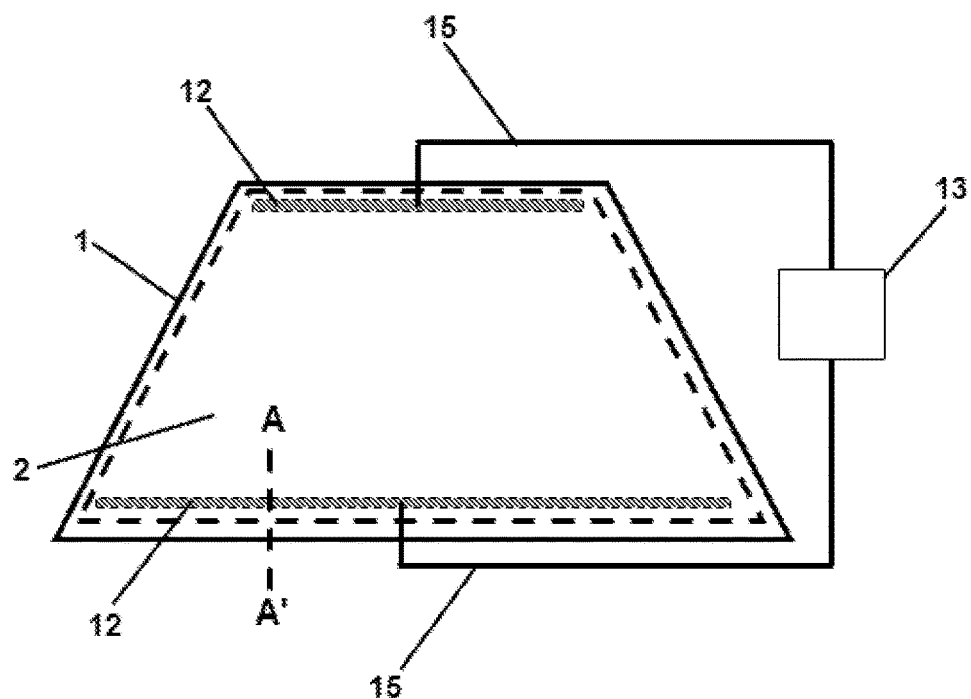

FIG. 2 a plan view of a transparent pane according to the invention as part of a composite pane.

Figure 3:
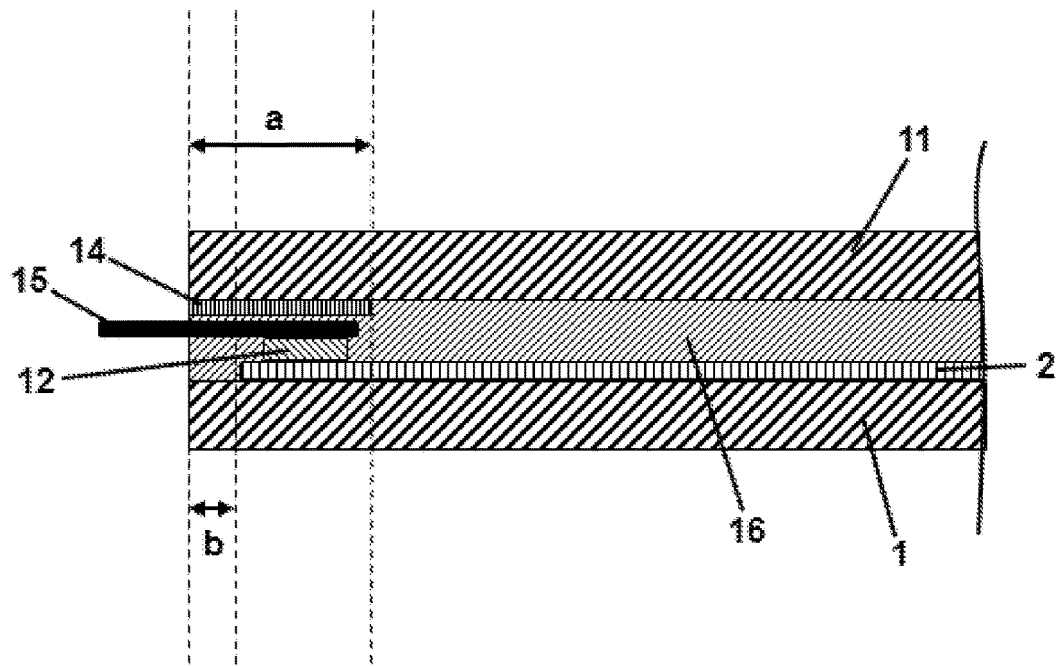

FIG. 3 a cross-section A-A' through the composite pane of FIG. 2.

Figure 4:
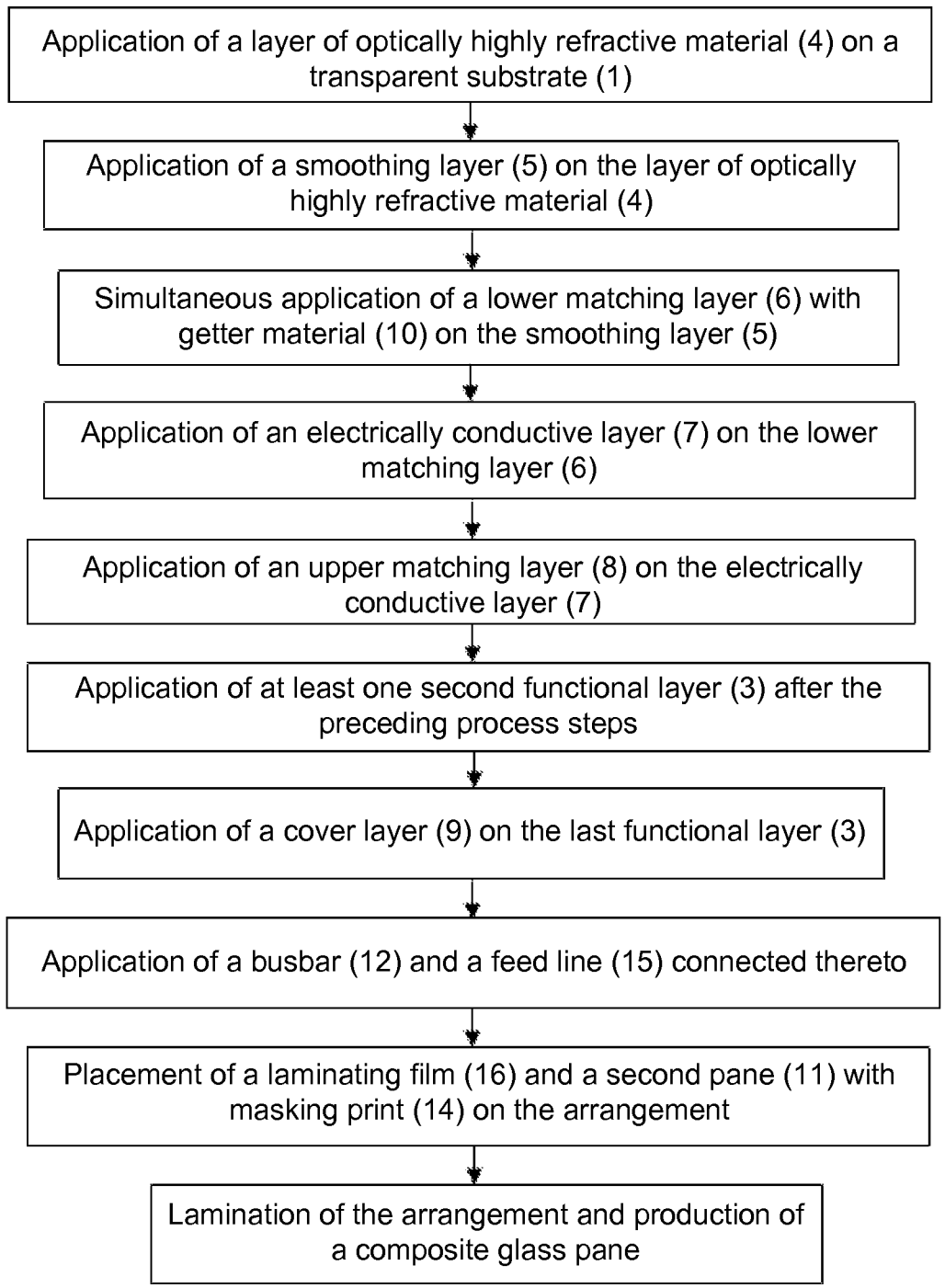

FIG. 4 a flowchart of the method according to the invention.

FIG. 1 depicts a cross-section through an embodiment of the transparent pane according to the invention with an electrically conductive coating with the transparent substrate (1) and the electrically conductive coating (2). The substrate (1) contains float glass and has a thickness of 2.1 mm. The electrically conductive coating (2) contains three functional layers (3), comprising a first functional layer (3.1), a second functional layer (3.2), and a third functional layer (3.3) that are congruently arranged one over another. Each functional layer (3) comprises
  one layer of an optically highly refractive material (4), respectively referred to as the first layer of an optically highly refractive material (4.1), the second layer of an optically highly refractive material (4.2), and the third layer of an optically highly refractive material (4.3),
  a smoothing layer (5), respectively referred to as the first smoothing layer (5.1), the second smoothing layer (5.2), and the third smoothing layer (5.3),
  a lower matching layer (6), respectively referred to as the first lower matching layer (6.1), the second lower matching layer (6.2), and the third lower matching layer (6.3),
  a getter material (10) contained in the first lower matching layer (6.1), the second lower matching layer (6.2), and the third lower matching layer (6.3),
  an electrically conductive layer (7), respectively referred to as the first electrically conductive layer (7.1), the second electrically conductive layer (7.2), and the third electrically conductive layer (7.3),
  an upper matching layer (8), respectively referred to as the first upper matching layer (8.1), the second upper matching layer (8.2), and the third upper matching layer (8.3).

The layers are arranged in the order indicated with increasing distance from the transparent substrate (1). A cover layer (9) is arranged above the third functional layer (3.3). The exact layer sequence of the functional layers (3.1, 3.2, 3.3) with suitable materials and exemplary layer thicknesses is, from the bottom to the top, glass with a thickness of 2.1 mm as the transparent substrate (1):

aluminum-doped mixed silicon/zirconium nitride (SiZrN$_x$:Al) as a layer of an optically highly refractive material (4) with a thickness of 28 nm (4.1), 59 nm (4.2), or 60 nm (4.3), antimony-doped mixed tin/zinc oxide (SnZnO$_x$:Sb) with a thickness of 6 nm as smoothing layers (5), titanium-doped zinc/aluminum oxide (ZnO:Al$_2$O$_3$:Ti) with a thickness of 10 nm as lower matching layers (6) with getter material (10), silver layer with a thickness of 18 nm as electrically conductive layers (7), zinc/aluminum oxide (ZnO:Al$_2$O$_3$) with a thickness of 5 nm as upper matching layers (8).

The first functional layer (3.1) is applied directly on the transparent substrate (1), while the second functional layer (3.2) is arranged on the first functional layer and the third functional layer (3.3) is arranged on the second functional layer (3.2).

The uppermost layer of the electrically conductive coating (2) forms a cover layer (9) that is applied on the third functional layer (3.3). The cover layer (9) is made of aluminum-doped mixed silicon/zirconium nitride (SiZrN$_x$:Al) with a layer thickness of 40 nm.

The individual layers of the electrically conductive coating (2) were deposited by cathode ray sputtering. The target for depositing the lower matching layers (6) contained 95 wt.-% of a zinc-oxide-based ceramic and 5 wt.-% titanium. The zinc-oxide-based ceramic contained 98 wt.-% ZnO and 2 wt.-% Al$_2$O$_3$. The target for depositing the upper matching layers (8) consisted of this zinc-oxide-based ceramic containing 98 wt.-% ZnO and 2 wt.-% Al$_2$O$_3$. The deposition of the matching layers (6, 8) was done using cathode sputtering in the presence of argon. The target for depositing the smoothing layers (5) contained 68 wt.-% tin, 30 wt.-% zinc, and 2 wt.-% antimony. The deposition was done under the addition of oxygen as reaction gas during the cathode sputtering. The target for depositing the layers of an optically highly refractive material (4) as well as the cover layer (9) contained 52.9 wt.-% silicon, 43.8 wt.-% zirconium, and 3.3 wt.-% aluminum. The deposition was done under addition of nitrogen as reaction gas during the cathode sputtering.

Through the design according to the invention of the electrically conductive coating (2) with lower matching layers (6) containing a getter material (10), reduced sheet resistance and, thus, improved specific heating output compared to the prior art are advantageously obtained. The combination of lower matching layer (6) and getter material (10) makes the use of an additional blocker layer for protection of the electrically conductive layer against oxygen obsolete. Thus, the lower matching layer (6) is in direct contact with the silver-containing electrically conductive layer (7), by which means crystalline growth of the silver is ensured. This improved crystallinity of the silver results in the desired reduction of the sheet resistance of the electrically conductive coating according to the invention. The optical properties of the transparent pane according to the invention with an electrically conductive coating satisfy the legal requirements for glazings in the automotive sector.

FIG. 2 and FIG. 3 depict in each case a detail of a transparent pane according to the invention with an electrically conductive coating (2) as part of a composite pane. The composite pane is intended as a windshield of a passenger car. The transparent substrate (1) is bonded to a second pane (11) via a laminating film (16). FIG. 2 depicts a plan view of the surface of the transparent substrate (1) facing away from the laminating film (16). The transparent substrate (1) is the pane facing the interior of the passenger car. The transparent substrate (1) and the second pane (11) contain float glass and have a respective thickness of 2.1 mm. The laminating film (16) contains polyvinyl butyral (PVB) and has a thickness of 0.76 mm.

An electrically conductive coating (2) is applied on the surface of the transparent substrate (1) facing the laminating film (16). The electrically conductive coating (2) extends over the entire surface of the transparent substrate (1) minus a circumferential frame-like coating-free region with a width b of 8 mm. The coating-free region serves as electrical insulation between the voltage-carrying electrically conductive coating (2) and the vehicle body. The coating-free region is hermetically sealed by gluing to the laminating film (16), in order to protect the electrically conductive coating (2) against damage and corrosion.

One busbar (12) each is arranged on the outer upper and lower edge of the transparent substrate (1). The busbars (12) were printed on the electrically conductive coating (2) using a conductive silver paste and fired. The layer thickness of the fired silver paste is 15 μm. The busbars (12) are electrically conductively connected to the underlying regions of the electrically conductive coating (2).

The feed lines (15) are made of tinned copper foils with a width of 10 mm and a thickness of 0.3 mm. Each feed line (15) is soldered to one of the busbars (12) respectively. The electrically conductive coating (2) is connected to a voltage source (13) via the busbars (12) and the feed lines (15). The voltage source (13) is the onboard voltage of 14 V of a motor vehicle.

An opaque ink layer with a width a of 20 mm is applied frame-like on the second pane (11) as a masking print (14) on the edge of the surface facing the laminating film (16). The masking print (14) conceals from view the strand of adhesive with which the composite pane is bonded into the vehicle body. The masking print (14) serves simultaneously as protection of the adhesive against UV radiation and thus as protection against premature aging of the adhesive. Moreover, the busbars (12) and the feed lines (15) are concealed by the masking print (14).

FIG. 3 depicts a cross-section along A-A' through the composite pane of FIG. 2 in the region of the lower edge. The transparent substrate (1) with the electrically conductive coating (2), the second pane (11), the laminating film (16), a busbar (12), and a feed line (15) as well as the masking print (14) are seen.

FIG. 4 depicts a flowchart of the method according to the invention. In a first step, one layer of an optically highly refractive material is deposited on a transparent substrate and, after that, a smoothing layer is applied thereon. A lower matching layer with a getter material is deposited on the smoothing layer, with the getter material being homogeneously distributed in the matching layer and being applied in one step therewith. An electrically conductive layer is applied on the lower matching layer and an upper matching layer is applied thereon. This yields a first functional layer consisting of a layer of an optically highly refractive material, a smoothing layer, a lower matching layer with a getter material, an electrically conductive layer, and an upper matching layer. At least one second functional layer, at most four more functional layers, are applied on this first functional layer. The layer system is completed by deposition of a cover layer on the uppermost functional layer. Subsequently, the layer system is electrically contacted by installation of a busbar with a feed line. A laminating film and a second pane with masking print are laid on the arrangement and the arrangement is laminated to produce a composite glass pane.

LIST OF REFERENCE CHARACTERS 1 transparent substrate
2 electrically conductive coating
3 functional layer
3.1 first functional layer
3.2 second functional layer
3.3 third functional layer
4 layer of an optically highly refractive material
4.1 first layer of an optically highly refractive material
4.2 second layer of an optically highly refractive material
4.3 third layer of an optically highly refractive material
5 smoothing layer
5.1 first smoothing layer
5.2 second smoothing layer
5.3 third smoothing layer
6 lower matching layer
6.1 first lower matching layer
6.2 second lower matching layer
6.3 third lower matching layer
7 electrically conductive layer
7.1 first electrically conductive layer
7.2 second electrically conductive layer
7.3 third electrically conductive layer
8 upper matching layer
8.1 first upper matching layer
8.2 second upper matching layer
8.3 third upper matching layer
9 cover layer
10 getter material
11 second pane
12 busbar
13 voltage source
14 masking print
15 feed line
16 laminating film
a with of the region masked by the masking print (14)
b width of the coating-free region
A-A' section line

The invention claimed is:

1. A transparent pane, comprising:
at least one transparent substrate; and
at least one electrically conductive coating on at least one surface of the at least one transparent substrate,
wherein each at least one electrically conductive coating has at least two functional layers arranged one above the other,
wherein each functional layer includes
a layer of an optically highly refractive material having a refractive index greater than or equal to 2.1,
a smoothing layer containing at least one non-crystalline oxide and being arranged above the layer of an optically highly refractive material,
a lower matching layer arranged above the smoothing layer,
an electrically conductive layer arranged above the lower matching layer, and
an upper matching layer arranged above the electrically conductive layer,
wherein at least one of the lower matching layer and the upper matching layer contains a homogeneously distributed getter material in a concentration from 1 wt. % to 10 wt. % selected from the group consisting of niobium, titanium, barium, magnesium, tantalum, zirconium, thorium, palladium, platinum, and alloys thereof, and
wherein the electrically conductive layer is in direct contact with the at least one of the lower matching layer or the upper matching layer.

2. The transparent pane according to claim 1, wherein at least one of the lower matching layer and the upper matching layer contains the getter material in a concentration from 4 wt.-% to 6 wt.-%.

3. The transparent pane according to claim 1, wherein the total layer thickness of all electrically conductive layers is from 32 nm to 75 nm.

4. The transparent pane according claim 1, wherein the layer of an optically highly refractive material contains at least one mixed silicon/metal nitride.

5. The transparent pane according claim 1, wherein the layer of an optically highly refractive material contains aluminum-doped mixed silicon/zirconium nitride.

6. The transparent pane according claim 1, wherein each layer of an optically highly refractive material arranged between two electrically conductive layers has a thickness from 35 nm to 70 nm.

7. The transparent pane according to claim 1, wherein the at least one non-crystalline mixed oxide contained in the smoothing layer includes a mixed tin/zinc oxide.

8. The transparent pane according to claim 7, wherein the mixed tin/zinc oxide is antimony-doped mixed tin/zinc oxide.

9. The transparent pane according to claim 1, wherein the smoothing layer has a thickness from 3 nm to 20 nm.

10. The transparent pane according claim 1, wherein the electrically conductive layer contains at least one of silver and a silver-containing alloy.

11. The transparent pane according claim 1, wherein the electrically conductive layer has a layer thickness from 8 nm to 25 nm.

12. The transparent pane according claim 1, wherein the electrically conductive layer has a layer thickness from 10 nm to 20 nm.

13. The transparent pane according claim 1, wherein at least one of the lower matching layer and the upper matching layer contains zinc oxide $ZnO_{1-\delta}$ with $0<\delta<0.01$.

14. The transparent pane according claim 1, wherein at least one of the lower matching layer and the upper matching layer has a thickness from 3 nm to 20 nm.

15. The transparent pane according claim 1, wherein a cover layer is arranged above the uppermost functional layer.

16. The transparent pane according to claim 15, wherein the cover layer contains at least one optically highly refractive material with a refractive index greater than or equal to 2.1.

17. The transparent pane according to claim 16, wherein the at least one optically highly refractive material is a mixed silicon/metal nitride.

18. The transparent pane according to claim 1, wherein the transparent substrate is bonded via at least one laminating film to a second pane to form a composite pane.

19. The transparent pane according to claim 18, wherein the total transmittance of the composite pane is greater than 70%.

20. A method of using a transparent pane, comprising:
providing the transparent pane of claim 1; and
installing the transparent pane as at least one pane or a component of a pane or as component of a composite pane in a building or in a means of transportation for travel on land, in the air, or on water.

21. A method for producing a transparent pane with an electrically conductive coating, comprising:
applying at least two functional layers one after another on a transparent substrate; and
applying within each functional layer one after another at least
  a) a layer of an optically highly refractive material with a refractive index greater than or equal to 2.1,
  b) a smoothing layer containing at least one non-crystalline oxide,
  c) a lower matching layer arranged above the smoothing layer,
  d) an electrically conductive layer, and
  e) an upper matching layer arranged above the electrically conductive layer,
wherein at least one of the lower matching layer and the upper matching layer is applied simultaneously with a getter material contained therein, wherein the getter material has a concentration of 1 wt.-% to 10 wt.-% selected from the group consisting of niobium, titanium, barium, magnesium, tantalum, zirconium, thorium, palladium, platinum, and alloys thereof; and
wherein the electrically conductive layer is applied in direct contact with the at least one of the lower matching layer containing the getter material or the upper matching layer.

22. A method for producing a transparent pane according to claim 21, wherein at least one of the lower matching layer and the upper matching layer are deposited by cathode ray sputtering of a ceramic target containing 1 wt.-% to 10 wt.-% of the getter material.

23. A method for producing a transparent pane according to claim 21, wherein at least one of the lower matching layer and the upper matching layer are deposited by cathode ray sputtering of a ceramic target containing 4 wt.-% to 6 wt.-% of the getter material.

24. A method for producing a transparent pane according to claim 21, wherein the electrically conductive coating is connected to at least two busbars, the transparent substrate and a second pane are heated to a temperature from 500° C. to 700° C., and the transparent substrate and the second pane are congruently bonded to a laminating film.

* * * * *